United States Patent [19]

Eaton, Jr.

[11] Patent Number: 5,255,222
[45] Date of Patent: Oct. 19, 1993

[54] OUTPUT CONTROL CIRCUIT HAVING CONTINUOUSLY VARIABLE DRIVE CURRENT

[75] Inventor: S. Sheffield Eaton, Jr., Colorado Springs, Colo.

[73] Assignee: Ramtron International Corporation, Colorado Springs, Colo.

[21] Appl. No.: 644,902

[22] Filed: Jan. 23, 1991

[51] Int. Cl.⁵ .............................................. G11C 11/34
[52] U.S. Cl. .......................... 365/189.09; 307/296.5; 307/296.8; 365/189.05; 365/189.11
[58] Field of Search .............. 365/189.05, 189.09, 365/189.11; 307/443, 475, 491, 296.4, 296.5, 296.8, 592, 594

[56] References Cited

U.S. PATENT DOCUMENTS

| | | |
|---|---|---|
| 4,057,789 | 11/1977 | Spadavecchia et al. ............ 365/189 |
| 4,595,844 | 6/1986 | Shen ................................ 307/296.5 |
| 4,855,623 | 8/1989 | Flaherty ............................ 307/491 |
| 4,961,010 | 10/1990 | Davis ................................. 307/451 |
| 4,974,203 | 11/1990 | Sakurai ........................... 365/189.05 |
| 5,043,944 | 8/1991 | Nakamura et al. ............ 365/189.05 |
| 5,045,772 | 9/1991 | Nishiwaki et al. ............ 365/189.09 |

FOREIGN PATENT DOCUMENTS 0408032  1/1991  European Pat. Off. .

*Primary Examiner*—Eugene R. LaRoche
*Assistant Examiner*—Christopher R. Glembocki
*Attorney, Agent, or Firm*—Edward D. Manzo

[57] ABSTRACT

In an output circuit for an integrated circuit memory, the current drawn by output transistors is lower at high $V_{CC}$ voltage range than at nominal $V_{CC}$. Maximum current is drawn at the low end of the $V_{CC}$ voltage range.

25 Claims, 1 Drawing Sheet

OUTPUT CONTROL CIRCUIT HAVING CONTINUOUSLY VARIABLE DRIVE CURRENT

BACKGROUND OF THE INVENTION

The present invention relates to the sizing of transistors in integrated circuits to optimize the efficiency thereof over a broader range of operating parameters. The preferred embodiment of this invention relates to an integrated circuit memory device, specifically a dynamic access memory ("DRAM"), and particularly the output circuit thereof.

Integrated circuit memory devices, (sometimes called "chips") store data and provide it to an output of the chip. The memory can be a static or dynamic RAM, or other types of memory such as read-only memory ("ROM"). Generally speaking, the prior art output circuits for such memories usually include two large field effect transistors ("FETs") at the output, and data that has been obtained from the memory cells within the chip are applied to these output transistors to drive a fairly substantial current at the output node. The capacitance associated with the output node is typically on the order of 50 picofarads. In the past, the time to drive a data output node was a manageable percentage of the total access time of a DRAM. With increasing memory capacity, however, and decreasing access times, it is important to keep the necessary time to drive the output node relatively small. Thus, it is important to drive the output pin or output node with a relatively large current provided by the output stage of the chip.

The design of any integrated circuit must necessarily take into consideration the operating parameters and restrictions imposed on the entire chip. A chip or integrated circuit will be connected to receive a source of operating voltage which in the field of MOS transistors is generally called $V_{CC}$. The operating voltage $V_{CC}$ may be 5.0 volts (nominally), but there is no certainty that this power supply voltage will stay constant. It must be assumed that there will be variations in $V_{CC}$, and integrated circuits in the DRAM field at least must meet specifications for the power supply voltage going higher than nominal. It may safely be assumed that the design must accommodate a power supply voltage of as low as 4.5 volts or as much as 5.5 volts (or more). These are referred to as "low" and "high" voltages, with the "nominal" voltage between them.

Whenever the power supply voltage rises to high voltage the transistors inherently work faster and draw more current. The same result occurs when temperature declines—and a wide temperature range is another operational requirement that must be considered in the design of the chip. The normal operating temperature can be referred to as "nominal," between low and high extremes. In order to accommodate the high currents which result at the extremes of the operating ranges specified for the chip, transistors are constructed to draw known currents at those extreme parameters. The result has been that the circuitry provides somewhat less than optimum performance at operating conditions that are less extreme (or nominal). With regard to the output circuit, in the past where the output circuitry is sized to draw maximum current at six volts, for example, the circuit would draw less current at four volts. By sizing the transistors in this prior art fashion, the current delivered when the power supply voltage is four volts is less than the current delivered when the power supply voltage is six volts. Accordingly, it has taken a longer time to drive the data output node with the power supply at four volts than at six volts.

It will be seen therefore that this aspect of integrated circuit design militates against achieving maximum performance at the nominal power supply output voltage. This factor unduly limits the speed of DRAMs since significant time is spent driving the data output node in the output circuit by using prior art techniques.

Accordingly, the main object of the present invention is to provide data output circuitry which can operate at high efficiency in nominal operating voltage specifications and temperature specifications even though it is designed to accommodate higher power supply voltages and lower temperatures. As used herein, "nominal" voltage is not limited to 5.0 volts, but for the expected, normal, typical voltage of the power supply.

It may generally be stated that an object of the present invention is to provide an improved output control circuit for an integrated circuit memory.

A more specific object of the present invention is to provide an output circuit so that the output transistors can be sized for maximum speed at a less extreme power supply voltage than the circuit is required to accommodate. Illustratively, if the power supply voltage is nominally five volts but may rise to six volts, an object of the present invention is to provide maximum speed at five volts instead of maximum speed at six volts.

SUMMARY OF THE INVENTION

The foregoing and other objects are achieved by providing a circuit so that the current drawn by the output transistors of an output control circuit in an integrated circuit memory is lower at the higher power supply voltage than it is at the nominal power supply voltage. This is achieved preferably by developing a voltage reference which is relatively independent of the power supply voltage $V_{cc}$ and by combining it with $V_{cc}$ to provide a further voltage which is applied to the control electrodes of output transistors. Preferably the output transistors are sized for maximum current at the minimum power supply voltage.

BRIEF DESCRIPTION OF THE DRAWINGS

In describing the present invention, reference is made to the accompanying drawings wherein.

DESCRIPTION OF THE PREFERRED EMBODIMENT

Figure 1:
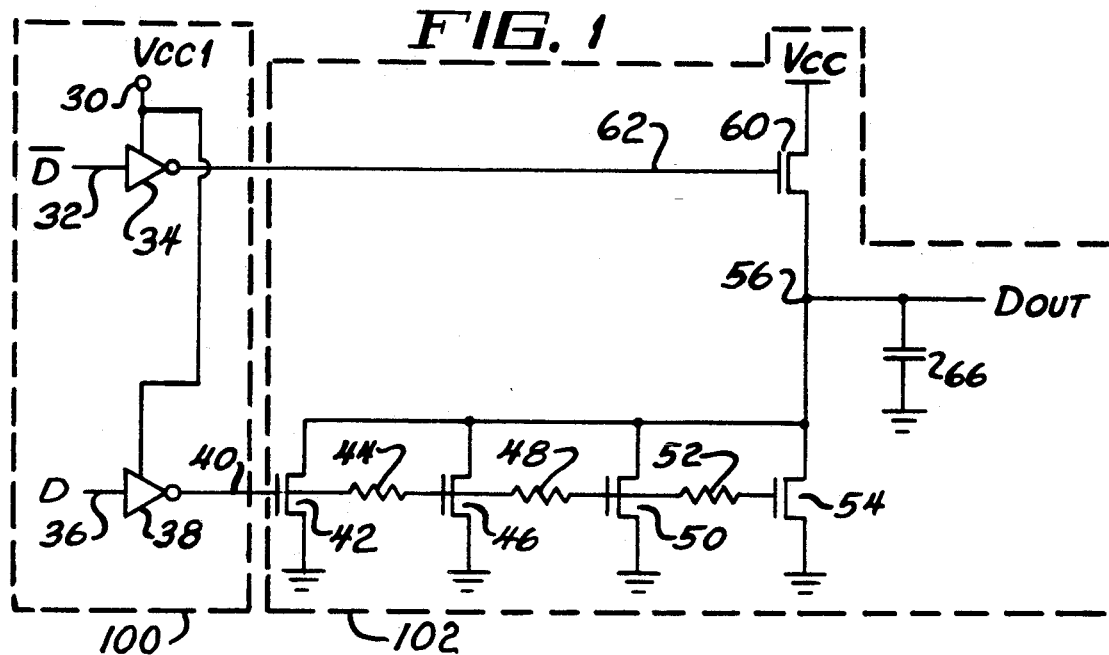
FIG. 1 represents an output control circuit according to the present invention.
Figure 2:
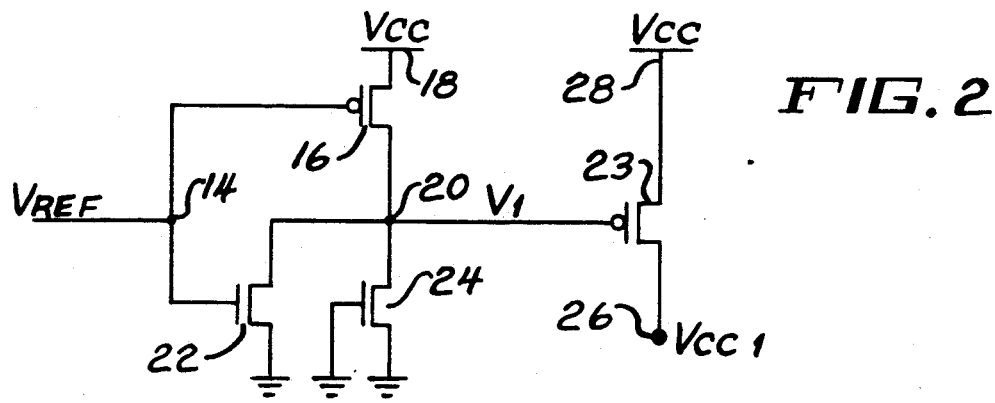
FIG. 2 is a schematic diagram showing how the input $V_{CC1}$ is derived for use in FIG. 1.
Figure 3:
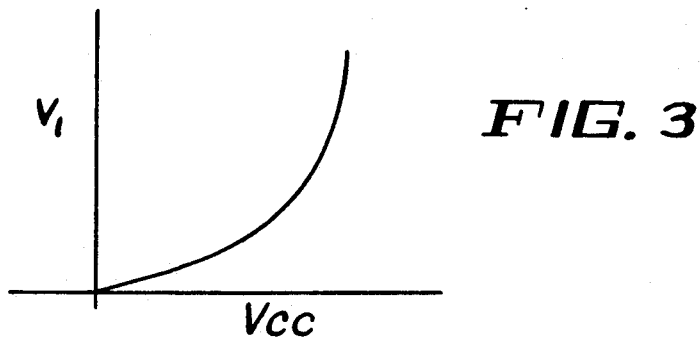
FIG. 3 is an illustration showing the relationship between a voltage $V_1$ to $V_{CC}$ in FIG. 2.

FIG. 1 illustrates an output control circuit according to several aspects of the present invention. Output control circuit 10 receives an input from a further circuit 12 which is illustrated in FIG. 2. FIG. 3 illustrates the relationship between the voltage at a node in FIG. 2 and the power supply voltage $V_{CC}$.

The circuit of FIG. 1 receives as inputs, to data receiving circuit complementary data D and D BAR, and it provides a data output $D_{out}$. The only other essential inputs to circuit 10 are the power supply voltage (operating voltage) $V_{CC}$, a reference potential (ground), and a voltage marked $V_{CC1}$. The latter voltage is derived from $V_{CC}$ by the circuit 12 shown in FIG. 2.

FIG. 2 receives a voltage reference input $V_{REF}$ at an input node 14, which is coupled to the gate electrode of a p-channel transistor 16. The source of transistor 16 is coupled to the power supply voltage $V_{CC}$ at node 18. The drain of transistor 16 is coupled to a node 20. The reference voltage is also applied to the gate electrode of a high impedance transistor 22. Transistor 22 is an n-channel device having its drain coupled to node 20 and its source coupled to ground. Node 20 is coupled also to the drain of a further n-channel FET 24, the gate electrode and source of which are both grounded. Node 20 provides a voltage $V_1$ which is applied to the gate electrode of a p-channel transistor 23. The drain 26 of transistor 23 provides the output $V_{CC1}$ used in FIG. 1. The source of transistor 23 is a node 28 which is coupled to the power supply voltage.

It will be understood that the $V_{REF}$ input to node 14 of FIG. 2 is a reference voltage that is substantially independent of $V_{CC}$. A circuit for generating such a voltage is shown and described in U.S. patent application Ser. No. 07/644,904 filed herewith, entitled REFERENCE GENERATOR FOR AN INTEGRATED CIRCUIT, now U.S. Pat. No. 5,117,177, issued May 26, 1992.

In FIG. 2, transistor 16 is sized relative to transistor 24 so that voltage at node 20 therebetween rises faster than rises occur in $V_{CC}$. FIG. 3 illustrates the relationship between $V_{CC}$ and $V_1$. It will be recalled that the conductivity of a p-channel transistor is dependent on the gate-to-source voltage. Specifically, if the gate voltage is below the source voltage by at least one threshold voltage $T_T$, then the transistor is ON (conductive). Consequently, considering transistor 23 of FIG. 2, if $V_1$ is six volts when $V_{CC}$ is six volts, then transistor 23 is OFF and no current passes therethrough. If $V_1$ is zero volts when $V_{CC}$ is four volts, then current will be drawn through transistor 23 from $V_{CC}$ to node 26. If $V_1$ is four volts when $V_{CC}$ is six volts, current is still drawn through transistor 23. The impedance of transistor 23, however, is greater at six volts than at four volts because $V_1$ has risen faster than $V_{CC}$ has risen (where $V_{CC}$ rose two volts, $V_1$ rose four volts.) Since $V_1$ rises faster than $V_{CC}$, it allows current through transistor 23 to be higher at four volts than at six volts.

Thus it will be appreciated that the circuit of FIG. 2 outputs a derived voltage or a modified power supply voltage which, over a range of power supply voltage values that can be supplied to or encountered in the device, rises faster than the power supply voltage rises. Preferably, the relationship between the modified power supply voltage and the power supply voltage is quadratic but could be linear so long as the derived power supply voltage is a function of the power supply voltage and increases faster than the power supply voltage increases.

The circuit of FIG. 1 combines the derived power supply voltage $V_{cc1}$ with the power supply voltage $V_{cc}$ at an output transistor so that maximum current can be drawn by the output transistor at four volts rather than six volts, illustratively. Referring to FIG. 1, the derived power supply voltage is $V_{cc1}$ is applied to an input 30. The complementary data input (DATA BAR) 32 together with the derived power supply voltage are applied to an inverter 34. The inverter typically comprises a CMOS pair of FETs with their source-drain paths coupled between ground and a source of operating voltage applied here at input 30. The input 32 is coupled to the gate electrodes, and the output node of the inverter is coupled to the drains of the FETs which operate in push-pull fashion. The data input is applied to an input 36 of a further inverter 38 which also receives the derived power supply voltage $V_{cc1}$. The output of inverter 38 is node 40.

As shown in FIG. 1, a set of transistors is coupled to node 40. Specifically, node 40 is coupled to the gate electrode of an n-channel transistor 42. From there it is further coupled via a resistor 44 to the gate electrode of another n-channel transistor 46. Additionally, via a resistor 48, that gate electrode is further coupled to the gate electrode of another n-channel transistor 50. Yet a further resistor 52 couples that gate electrode to the gate electrode of a further n-channel transistor 54. The drain electrodes of transistors 42, 46, 50 and 54 are all coupled to a node 56. The source electrodes of transistors 42, 46, 50 and 54 are all grounded.

This set or network of transistors and resistors provide RC coupling in a different fashion than used in the prior art. The capacitance referred to herein is the capacitance of the gate electrodes of the transistors. Previously, in order to decrease the peak current, an output circuit used an output transistor having a long distributed resistance gate, illustratively 500 microns long. The present configuration has been found to be more efficient than simply applying a data signal to a pull-down transistor with a long resistance gate. This has not been found to be true for the pull-up transistor 60 which is also shown in FIG. 1. Transistor 60 is preferably an n-channel transistor having its drain coupled to the power supply voltage $V_{cc}$ and its source coupled to node 56, which provides the output $D_{out}$. Transistor 60 is responsively coupled to the inverter 34 by virtue of a node 62 coupled to the output of inverter 34 and to the gate electrode of transistor 60.

If the circuit of FIG. 1 were drawn according to the prior art, it would not use the derived power supply voltage $V_{cc1}$, nor would it use the discrete RC network. Pull-up transistor 60 would be sized to draw its maximum current at the highest specified power supply voltage, illustratively six volts. However, since the nominal power supply voltage is below the highest permissible power supply voltage, the speed of transistor 60 would be slower at the nominal power supply voltage than at the high power supply voltage. It would take a longer time at the nominal power supply voltage to drive the capacitance coupled to output node 56 to the proper data value than it would at the high power supply voltage By virtue of the present invention, however, transistor 60 does not need to be sized for maximum current at the high power supply voltage. Instead, as described above, the derived power supply voltage $V_{cc1}$ rises faster than $V_{cc}$ and the current through transistor 23 at the power supply voltage is greater than the current therethrough at the high power supply voltage.

The operation of transistor 23 provides a corresponding operation in the circuit of FIG. 1. Specifically, the rise time of node 62 is slower at six volts (high) than it is at four volts (low). This is because less current is drawn at six volts than at four volts. Accordingly, more current is drawn through output pull-up transistor 60 at the low power supply voltage of four volts than at the high power supply voltage which is illustratively six volts.

Consequently, transistor 60 is sized for maximum speed at the low voltage of four volts, thereby improving the operation of the output circuitry for an integrated circuit memory device. Some of the sizes of the devices in the drawings are as follows, giving transistor width/lengths in microns:

16=8/3
22=2/20
23=250/1.5
24=3/3
42=72/1.1
44, 48, 52=1600 ohms
46=36/1.1
50=55/1.1
54=210/1.1
66=50 pf.
$V_{REF}$=3.5 V

I claim:

1. An output circuit for an integrated circuit memory designed to operate over a range of power supply voltages including a nominal voltage and a high voltage, the output circuit comprising:
   a data receiving circuit connected to receive a data signal to be output from the memory;
   a data output circuit having an output node and an output transistor having first, second, and control terminals,
   the control terminal being responsively coupled to said data receiving circuit,
   said first terminal being connected to receive the power supply voltage,
   said second terminal being coupled to said output node; and
   a circuit providing a derived power supply voltage to said data receiving circuit, said derived power supply voltage being a function of the power supply voltage,
   the data receiving circuit, the circuit providing a derived power supply voltage, and the data output circuit being configured so that current drawn through said output transistor is higher at said nominal voltage than at said high voltage, and wherein the output circuit is configured to drive said output node with an output current that varies continuously in accordance with continuous changes in the power supply voltage over said range.

2. The circuit of claim 1 wherein said output transistor is an n-channel field effect having a drain electrode coupled to receive the power supply voltage, a source electrode providing an output signal to said output node, and a gate electrode coupled to rise in voltage in accordance with said derived power supply voltage and the state of the data applied to said data receiving circuit.

3. The circuit of claim 1 wherein said circuit for providing the derived power supply voltage comprises:
   an input for receiving a reference voltage;
   an input for receiving the power supply voltage;
   an internal node for developing a voltage based on the power supply voltage and the reference voltage; and
   a first transistor responsively coupled to said internal node and coupled to receive the power supply voltage and providing said derived power supply voltage.

4. The circuit of claim 3 wherein said circuit for providing the derived power supply voltage further includes second and third transistors each having source-drain paths, the source-drain path of said second transistor coupling the power supply voltage to said internal node, the source-drain path of said third transistor coupling said internal node to another power supply voltage, said second and third transistors being sized with respect to each other so that the voltage developed at the internal node rises faster than the power supply voltage rises.

5. An output circuit for an integrated circuit memory designed to operate over a range of power supply voltages including a nominal power supply voltage and a high power supply voltage, the output circuit comprising:
   a data receiving circuit;
   a data output circuit having an output transistor responsively coupled to said data receiving circuit, the data output circuit including an output node connected to said output transistor, the output circuit being configured so that current drawn through said output transistor is higher at said nominal voltage than said high voltage, and wherein said output node current varies continuously in accordance with continuous changes in the power supply voltage over said range;
   a circuit providing a derived power supply voltage to said data receiving circuit, said derived power supply voltage being a function of the power supply voltage so that said output transistor draws less current at the high power supply voltage than at said nominal power supply voltage;
   said data receiving circuit comprising first and second inverters, each coupled to receive the derived power supply voltage and a data input signal, said first inverter having an output coupled to the gate electrode of said output transistor, said second inverter having an output; and
   a network of transistors and resistors configured to decrease peak current, said second inverter output being coupled to gate electrodes of said network transistors directly and through said resistors, said output transistor and said network being coupled at said output node.

6. The circuit of claim 5 wherein said network comprises first and second transistors having source, drain, and gate electrodes, the gate electrode of the first transistor being coupled to the output of the second inverter, a resistor being coupled between the gate electrodes of said first and second transistors, the source-drain path of said first and second transistors being coupled to said output node.

7. The circuit of claim 5 wherein said network comprises a plurality of transistors having their drain electrodes coupled in common, their source electrodes coupled in common, and their gate electrodes coupled in series via respective resistors, said plurality of transistors including n-channel transistors, said output node being coupled to the drains of said n-channel transistors.

8. The circuit of claim 7 wherein the transistors within said network comprise only n-channel transistors.

9. An output circuit for an integrated circuit memory designed to operate over a range of power supply voltages including a nominal voltage and a high voltage received from a power supply voltage source, the output circuit comprising:
   an output node providing the data output;
   a pull-up transistor having a source-drain path coupled to said output node and to the power supply voltage source;
   a pull-down transistor coupled between said output node and a reference potential; p1 a data receiving circuit coupled to receive data signals from the memory corresponding to the output signal to be developed at the output node;

a circuit providing a derived power supply voltage to said data receiving circuit, the derived power supply voltage being a function of the power supply voltage;

said pull-up transistor and said pull-down transistor each having a respective gate electrode coupled to said data receiving circuit;

said circuit providing the derived power supply voltage cooperating with said data receiving circuit so that the rise time on the gate electrode of said pull-up or pull-down transistor is higher at nominal voltage than at said higher voltage so that more current is drawn through said pull-up or pull-down transistor at the nominal voltage than at the high voltage.

10. The circuit of claim 9 wherein said pull-up transistor is sized for maximum current at said nominal voltage.

11. The circuit of claim 9 wherein said pull-up transistor comprises an n-channel transistor.

12. The circuit of claim 9 wherein said pull-down transistor comprises a network of transistors and resistors, the resisters coupling together the gate electrodes of the transistors of the network.

13. A method of providing a data output in an integrated circuit memory designed to operate over a range of power supply voltages extending to a high voltage and including a nominal voltage, comprising the steps of:

receiving data at an input circuit in accordance with which an output node is to be driven;

generating a derived power supply voltage based on the actual power supply voltage and applying the derived power supply voltage to the input circuit, so that the input circuit provides a signal that is a function of the derived power supply voltage and the received data, the derived power supply voltage changing more rapidly than variations of the actual power supply voltage within the range, said generating step including controlling a current drawn at an internal node in accordance with the derived power supply voltage so that less current is drawn at the high power supply voltage value than at the nominal voltage value;

controlling at least one output transistor of an output sage with said signal provided by the input circuit, while applying the power supply voltage to the output stage; and developing the output signal at the output node in accordance with the current drawn on the internal node and the data received at the input circuit.

14. The method of claim 13 wherein said step of generating a derived power supply voltage includes continuously varying the derived power supply voltage in response to continuous changes over said range of power supply values.

15. An output circuit for an integrated circuit memory designed to operate over a range of power supply voltages including a minimum specified voltage, a nominal voltage and a high voltage, the output circuit comprising:

an input circuit coupled to receive the data on which a data output signal is to be based, the input circuit being configured to draw more current at the nominal power supply voltage than at the higher voltage, the input circuit providing a modified data signal;

an output driver circuit powered by the power supply voltage and coupled to receive the modified data signal from said input circuit, wherein said output driver circuit provides the data output signal, said data output signal varying continuously in accordance with variations over said range of power supply voltage.

16. The circuit of claim 15 wherein said output driver circuit includes an output transistor having a current path coupled to the power supply voltage, said output transistor being sized for maximum current at the minimum specified voltage.

17. An output circuit for an integrated circuit memory comprising:

an output node providing the data output;

a pull-up transistor having a source-drain path coupled to said output node and to a first power supply voltage;

a pull-down transistor coupled between said output node and a second power supply voltage;

a data receiving circuit coupled to receive data signals from the memory corresponding to the output signal to be developed at the output node;

a network of resistor sand transistors having source, drain, and gate electrodes, the gate electrode of each network transistor being coupled to said data receiving circuit, at least one of said resistors being coupled between adjacent gate electrodes of said network transistors the source-drain path of each of said transistors being coupled to said output node.

18. The circuit of claim 17 wherein said network transistors have their drain electrodes coupled in common, their source electrodes coupled in common, and their gate electrodes coupled together by respective said resistors, said plurality of transistors including n-channel transistors, said output node being coupled to the drains of said n-channel transistors.

19. The circuit of claim 18 wherein said network transistors comprise only n-channel transistors.

20. An output circuit for an integrated circuit memory operable over a range of power supply voltages including a nominal voltage and a high voltage, the output circuit comprising:

a voltage-modifying circuit coupled to receive a reference voltage and said power supply voltage, configured to provide a derived voltage related to the power supply voltage;

an input circuit coupled to receive said derived voltage from said voltage-modifying circuit, and coupled further to receive a data signal, the input circuit providing a modified data signal that is based on at least the data signal and the derived voltage;

an output transistor and an output node and the power supply voltage, a control electrode of said output transistor being responsively coupled to said modified data signal from said input circuit.

21. The circuit of claim 20 wherein said input circuit comprises an inverter coupled to receive said derived voltage and said data signal and to drive an inverter output, in accordance with the logic state of the data signal, between said derived voltage and another voltage, the inverter output being said modified data signal.

22. The circuit of claim 20 wherein said input circuit further includes a further inverter, the circuit further comprising a further output transistor having a source-drain path coupled between said output node and a second power supply voltage, the further inverter having an input coupled to receive a complementary data signal, the further inverter having an output coupled to said further output transistor.

23. An output circuit for an integrated circuit memory operable over a range of power supply voltages including a nominal voltage and a high voltage, the output circuit comprising:
 a voltage-modifying circuit coupled to receive a reference voltage and said power supply voltage, configured to provide a derived voltage related to the power supply voltage;
 an input circuit coupled to receive said derived voltage from said voltage-modifying circuit, and coupled further to receive a data signal;
 an output transistor and an output node, a source-drain path of the output transistor being coupled to said output node, a control electrode of said output transistor being responsively coupled to said input circuit
 wherein said voltage-modifying circuit comprises an input node for receiving said reference voltage, first and second p-channel transistors, a first node an n-channel transistor, and an output node the n-channel transistor having its source-drain path coupled between said first node and ground;
 the first p-channel transistor having its source-drain path coupled between the power supply voltage and said first node, and its gate electrode responsively coupled to said input node;
 the second p-channel transistor having its source-drain path coupled between the power supply voltage and the output node, and its gate electrode coupled responsively to said first node,
 the first p-channel transistor being sized relative to the n-channel transistor so that a voltage developed at said first node rises faster than it rises in the power supply voltage.

24. The circuit of claim 23 wherein said voltage-modifying circuit further comprises a further n-channel transistor having its source-drain path coupled between said first node and ground, and its gate electrode coupled to said input node.

25. A method of driving an output node in accordance with data comprising the steps of:
 applying the data to a first stage circuit driving its output between a derived power supply voltage and ground in accordance with the data state to provide a modified data signal;
 applying the modified data signal to a control electrode of an output transistor in a subsequent stage; and
 generating said derived power supply voltage by producing a voltage that is a quadratic function of a power supply voltage over a range of operating values thereof.

* * * * *

UNITED STATES PATENT AND TRADEMARK OFFICE
CERTIFICATE OF CORRECTION

PATENT NO. : 5,255,222

DATED : October 19, 1993

INVENTOR(S) : Eaton, Jr.

It is certified that error appears in the above-identified patent and that said Letters Patent is hereby corrected as shown below:

Title page, item [73]:
In the list of Assignees, insert --Nippon Steel Semiconductor Co., Ltd., Japan--.

Signed and Sealed this

Twentieth Day of September, 1994

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,255,222
DATED : October 19, 1993
INVENTOR(S) : S. Sheffield Eaton, Jr.

It is certified that error appears in the above-indentified patent and that said Letters Patent is hereby corrected as shown below:

On the title page, item [73]:
   In the Assignee, list the assignees as follows:

-- Ramtron International Corporation, Colorado Springs,

Colo. and Nippon Steel Semiconductor Co., Ltd. Japan. --

This certificate supersedes Certificate of Correction issued September 20, 1994.

Signed and Sealed this

Sixth Day of December, 1994

Attest:

BRUCE LEHMAN

*Attesting Officer*   *Commissioner of Patents and Trademarks*